(12) United States Patent
Soyano

(10) Patent No.: US 9,966,344 B2
(45) Date of Patent: May 8, 2018

(54) SEMICONDUCTOR DEVICE WITH SEPARATED MAIN TERMINALS

(71) Applicant: FUJI ELECTRIC CO., LTD., Kawasaki-shi, Kanagawa (JP)

(72) Inventor: Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/360,562

(22) Filed: Nov. 23, 2016

(65) Prior Publication Data

US 2017/0077044 A1    Mar. 16, 2017

Related U.S. Application Data

(63) Continuation of application No. PCT/JP2015/081932, filed on Nov. 13, 2015.

(30) Foreign Application Priority Data

Nov. 28, 2014  (JP) ................................. 2014-241811

(51) Int. Cl.
*H01L 23/00* (2006.01)
*H01L 23/48* (2006.01)
(Continued)

(52) U.S. Cl.
CPC .......... *H01L 23/562* (2013.01); *H01L 23/047* (2013.01); *H01L 23/367* (2013.01);
(Continued)

(58) Field of Classification Search
CPC ..... H01L 23/562; H01L 23/367; H01L 24/49; H01L 25/072; H02M 7/003
See application file for complete search history.

(56) References Cited

U.S. PATENT DOCUMENTS 5,616,955 A * 4/1997 Yamada ................. H01L 24/49
257/690
5,956,231 A * 9/1999 Yamada ............... H01L 23/049
257/678

(Continued)

FOREIGN PATENT DOCUMENTS

JP    H11-004584 A    1/1990
JP    2002-299552 A   10/2002

(Continued)

OTHER PUBLICATIONS

International Search Report of PCT/JP2015/081932 dated Feb. 2, 2016.

*Primary Examiner* — William Coleman
(74) *Attorney, Agent, or Firm* — Manabu Kanesaka

(57) ABSTRACT

A semiconductor device includes a plurality of main terminals extending from one end of a base plate toward the other end thereof, a group of semiconductor chips on a side of higher electric potential disposed on one side of the main terminal and mounted on the base plate, and a group of semiconductor chips on a side of lower electric potential disposed on the other side of the main terminal and mounted on the base plate. The one main terminal has an extending portion extending, in a direction perpendicular to the extending direction of the main terminal, toward one of both sides of the main terminal, and two adjacent semiconductor chips in one of the group of semiconductor chips on the side of higher electric potential and the group of semiconductor chips on the side of lower electric potential are axisymmetrically disposed with respect to the extending portion.

19 Claims, 8 Drawing Sheets

(51) Int. Cl.
  *H01L 23/047*   (2006.01)
  *H01L 23/367*   (2006.01)
  *H01L 25/07*    (2006.01)
  *H02M 7/537*    (2006.01)
  *H02M 7/00*     (2006.01)
  *H01L 25/18*    (2006.01)

(52) U.S. Cl.
  CPC ............ *H01L 23/48* (2013.01); *H01L 24/49* (2013.01); *H01L 25/072* (2013.01); *H02M 7/003* (2013.01); *H02M 7/537* (2013.01); *H01L 25/18* (2013.01); *H01L 2224/4846* (2013.01); *H01L 2224/48227* (2013.01); *H01L 2224/4903* (2013.01); *H01L 2224/49111* (2013.01); *H01L 2224/49112* (2013.01); *H01L 2924/0002* (2013.01); *H01L 2924/1203* (2013.01); *H01L 2924/13055* (2013.01); *H01L 2924/13091* (2013.01); *H01L 2924/14253* (2013.01); *H01L 2924/3511* (2013.01)

(56) References Cited

U.S. PATENT DOCUMENTS

| | | | |
|---|---|---|---|
| 6,528,880 B1 * | 3/2003 | Planey | H01L 23/49562 257/341 |
| 7,589,412 B2 * | 9/2009 | Kashimoto | H01L 21/565 257/693 |
| 7,768,118 B2 * | 8/2010 | Yoshida | H01L 23/3107 257/690 |
| 9,147,666 B2 * | 9/2015 | Yoshihara | H01L 23/645 |
| 9,171,768 B2 * | 10/2015 | Takamiya | H01L 23/055 |
| 9,214,415 B2 * | 12/2015 | Denison | H01L 24/34 |
| 9,325,257 B2 * | 4/2016 | Okayama | H02M 7/003 |
| 9,431,376 B2 * | 8/2016 | Hartmann | H01L 24/49 |
| 2002/0140078 A1 | 10/2002 | Yamada | |
| 2010/0089607 A1 | 4/2010 | Nakamura et al. | |
| 2015/0235923 A1 | 8/2015 | Yasuda | |
| 2015/0380338 A1 * | 12/2015 | Hori | H01L 25/07 257/693 |

FOREIGN PATENT DOCUMENTS

| | | |
|---|---|---|
| JP | 2004-153243 A | 5/2004 |
| JP | 2004-214452 A | 7/2004 |
| JP | 2006-202885 A | 8/2006 |
| JP | 2013-089784 A | 5/2013 |
| JP | 2013-131590 A | 7/2013 |
| JP | 2014-56920 A | 3/2014 |
| WO | 2008/102914 A1 | 8/2008 |

* cited by examiner

US 9,966,344 B2

SEMICONDUCTOR DEVICE WITH SEPARATED MAIN TERMINALS

CROSS-REFERENCE TO RELATED APPLICATIONS

This application is a continuation of PCT Application No. PCT/JP2015/081932, which claims priority to Japanese Patent Application No. 2014-241811, filed Nov. 28, 2014. The contents of these applications are incorporated herein by reference in their entirety.

TECHNICAL FIELD

The present invention relates to a semiconductor device, and particularly to a semiconductor device including a power semiconductor element mounted thereon.

BACKGROUND ART

Power semiconductor modules, as semiconductor devices, including one or two or more power semiconductor elements (semiconductor chips) embedded in a case the interior of which is sealed with a sealing material are known. For power semiconductor modules used for inverter circuits among others, switching elements such as IGBTs (Insulated Gate Bipolar Transistors) and MOSFETs (Metal Oxide Semiconductor Field Effect Transistors) and passive elements such as FWDs (Free Wheeling Diodes) are used as the semiconductor elements.

FIG. 11 illustrates one example of conventional power semiconductor modules.

Power semiconductor elements, as semiconductor chips 105 based on silicon or silicon carbide (SiC), are mounted on and bonded by solder or the like to a circuit plates 106c of an insulating substrate 106. The circuit plates 106c of the insulating substrate 106 include a wiring pattern formed thereon which configures an electric circuit. An electrode formed on the upper surface of the semiconductor chip 105 of the power semiconductor module 100 is electrically connected to the circuit plate 106c by bonding wires 107 made of aluminum, and terminals 141, 142, and 143 are bonded to the circuit plates 106c by welding or soldering. Copper leads (conducting plates) may be used for the electrical connection in place of the bonding wires 107.

When the electric circuit is configured by a plurality of power semiconductor chips mounted on the insulating substrate, wiring patterns of the circuit plate of the insulating substrate tend to be complicated. In addition, since the number of bonding wires increases which electrically connect an electrode formed on the upper surface of the power semiconductor chip to the circuit plate or the like, the power semiconductor module is likely to be large owing to a longer time required for the bonding and the increase in the area of regions to be wired.

A power semiconductor device is disclosed which includes, in order to miniaturize the power semiconductor module, an external terminal one end of which is exposed outside the case and the other end of which is bonded, in the case, to a circuit pattern different from a circuit pattern surmounted by a power semiconductor chip and is connected to the power semiconductor chip by a bonding wire (Patent document 1).

Further, a power semiconductor device is disclosed which includes a resin block which is integrated, by using resin, with a plurality of main terminals interposing insulation layers and is placed on a heat-dissipating plate in such a way that the block bisects the heat-dissipating plate in the case, and also includes a power semiconductor chip connected to the main terminal of the resin block by a bonding wire (Patent document 2).

Still further, a power semiconductor module is disclosed which includes a plurality of electrode-leading terminals supported by a terminal-supporting resin which has a first crossover portion and a second crossover portion, the first crossover portion being disposed, in the resin case, in such a way that it cross the resin case from a central portion on one edge of the resin case to that on the opposite edge thereof, and the second crossover portion extending from the central portion to the both sides, of the first crossover portion, wherein a semiconductor switching element is bonded to each of four spaces inside the resin case divided by the first and second crossover portions, wherein the first electrode-leading terminal is wire-bonded to a wiring pattern connected to the semiconductor switching element, and the second electrode-leading terminal is formed on the surface of the semiconductor switching element and wire-bonded to the electrode (Patent document 3).

RELATED ART DOCUMENTS

Patent Documents

Patent document 1 JP-A-2002-299552
Patent document 2 JP-A-2004-153243
Patent document 3 JP-A-2013-131590

SUMMARY OF THE INVENTION

Problems to be Solved by the Invention

The techniques described in Patent documents 1 to 3 are useful, for example, in miniaturization of power semiconductor modules. However, there has been room for further improvement in the case of a power semiconductor module configuring a more complex electric circuit, such as a power semiconductor module including an upper arm and a lower arm configuring an inverter.

Therefore, an object of the present invention is to provide a semiconductor device which enables miniaturization of a power semiconductor module configuring a complex electric circuit by modifying the circuit wiring in the power semiconductor module.

Means for Solving the Problems

The following semiconductor device is provided to accomplish the above-mentioned object.

A semiconductor device according to an embodiment of the present invention includes a plurality of main terminals extending, on a base plate, from one end of the base plate toward other end thereof, a group of semiconductor chips on a side of higher electric potential disposed in array by one side of the main terminal and mounted on the base plate, and a group of semiconductor chips on a side of lower electric potential disposed in array by the other side of the main terminal and mounted on the base plate. One of the main terminals has an extending portion extending in a direction perpendicular to an extending direction of the main terminal, toward any one of the both sides of the main terminal, and two adjacent semiconductor chips in any one of the group of semiconductor chips on the side of higher electric potential and the group of semiconductor chips on the side of lower electric potential are disposed axisymmetrically with respect to the extending portion.

Effects of the Invention

According to the present invention, power semiconductor modules configuring a complex electric circuit can be miniaturized by modifying circuit wiring in the module.

MODE FOR CARRYING OUT THE INVENTION

Embodiments of the power semiconductor module (semiconductor device) of the present invention will be concretely explained with reference to the drawings.

Embodiment 1

Figure 1:
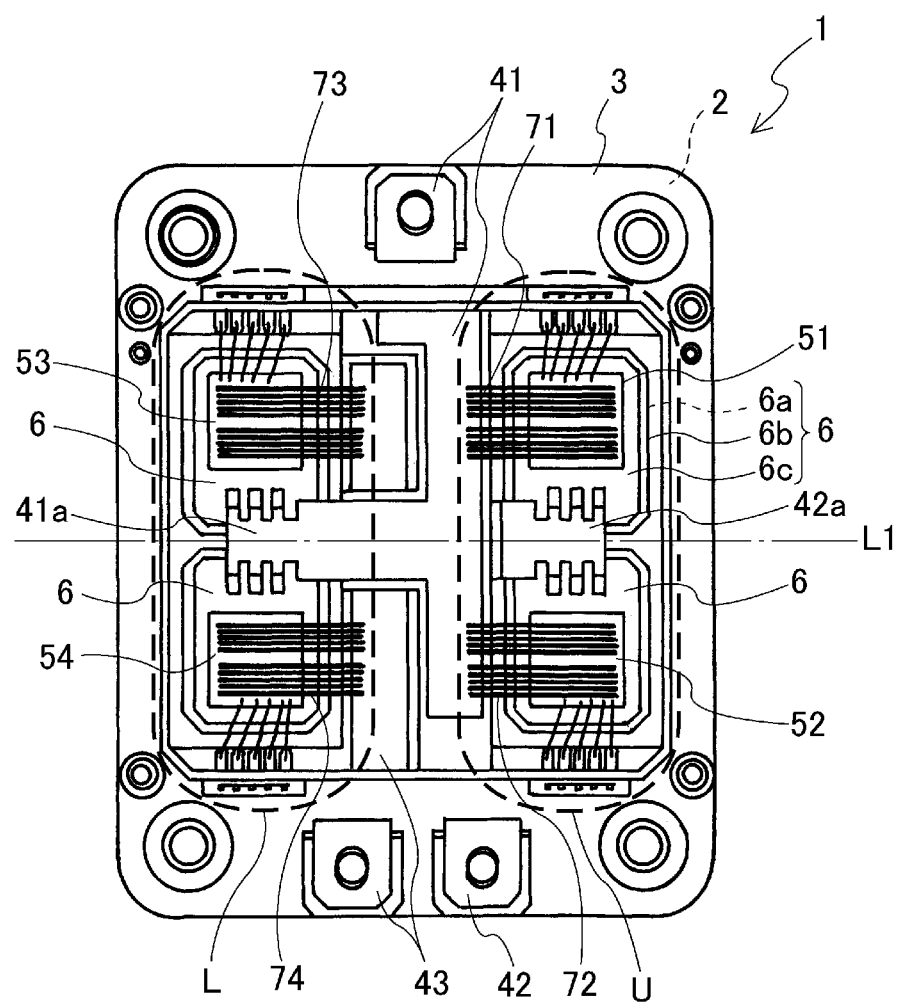
FIG. 1 is a plan view of a power semiconductor module of Embodiment 1 of the present invention.
Figure 2:
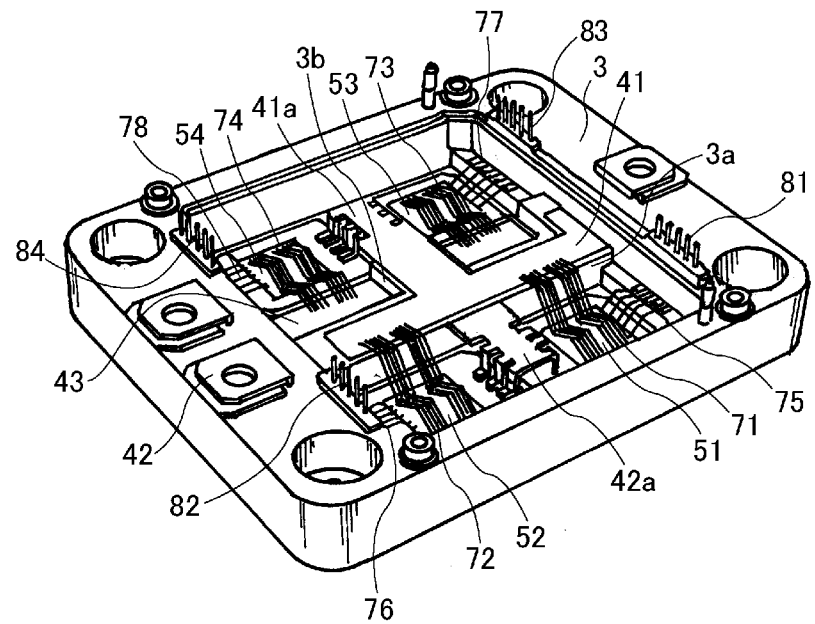
FIG. 2 is a perspective view of the power semiconductor module in FIG. 1.

FIG. 1 depicts a plan view of a power semiconductor module 1 which is a semiconductor device of Embodiment 1 of the present invention, and FIG. 2 depicts a perspective view of the power semiconductor module 1 in FIG. 1. The power semiconductor module 1 in FIG. 1 and FIG. 2 is provided with a base plate 2 made of metal. In the following descriptions, a vertical direction means a direction perpendicular to the front surface (main surface) of the base plate 2, and a horizontal direction means a direction parallel to the front surface (main surface) of the base plate 2.

The base plate 2 has a flat surface of a rectangular shape. The base plate 2 is provided with a resin case 3 thereon. The resin case 3 has a size approximately equal to that of the base plate 2 according to the plan view and a roughly rectangular and hollow parallelepiped shape. The resin case 3 has a roughly rectangular opening according to the plan view. The resin case 3 is fixed by adhesive (not illustrated) to the periphery of the base plate 2.

A first main terminal 41, a second main terminal 42, and a third main terminal 43 are attached integrally to the resin case 3 by insert-form. The first main terminal 41 corresponds to an intermediate terminal in one phase configuring an inverter circuit. The second main terminal 42 corresponds to a P-terminal in one phase configuring the inverter circuit. The third main terminal 43 corresponds to an N-terminal in one phase configuring the inverter circuit.

Figure 3:
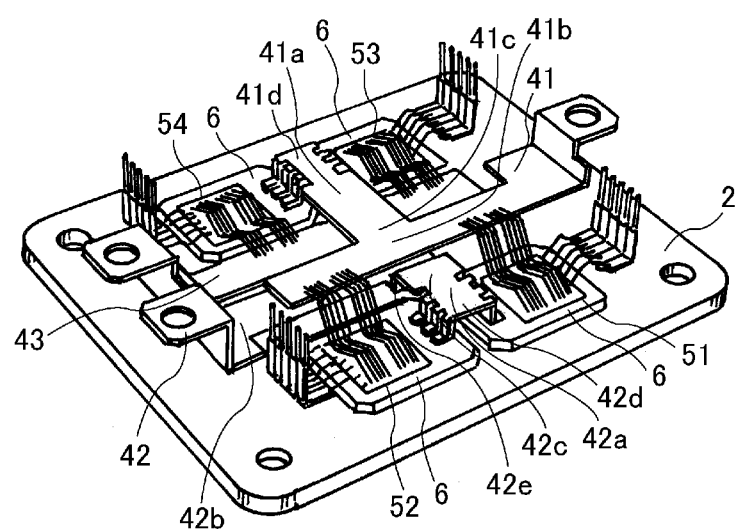
FIG. 3 is a perspective view depicting the internal structure of the power semiconductor module in FIG. 1.

FIG. 3 depicts a perspective view of an internal structure excluding the resin case 3 in the power semiconductor module 1.

The first main terminal 41 is placed in such a way that one end of the terminal is exposed on the upper surface of the resin case 3 and the other end of the terminal extends, in the hollow space of the resin case 3, from one edge of the opening of the resin case to the edge opposite thereto so as to bisect the opening of the resin case. The second main terminal 42 and the third main terminal 43 are placed in such a way that they are exposed on the upper surface of the resin case 3 on the side opposite to the side where the one end of the first main terminal 41 is exposed, and the other ends of the second and third terminals extend, in a hollow space of the resin case 3, from one edge of the opening of the resin case to the edge opposite thereto so as to bisect the opening of the resin case.

The first main terminal 41 and the second main terminal 42 are placed at a space from each other so as to be positioned on the same line perpendicular to the front surface of the base plate 2. In other words, the first main terminal 41 and the second main terminal 42 are placed at a space from each other in a vertical direction in the hollow space of the resin case 3 so as to be partially overlapped with each other. An insulating plate made of an insulation resin or a beam 3a of the resin case 3 is placed between the first main terminal 41 and the second main terminal 42 and between the second main terminal 42 and the base plate 2, facilitating wire-bonding to the first main terminal 41. In addition, placing the beam 3a in the resin case 3 is effective to reduce warpage of the power semiconductor module 1.

The second main terminal 42 and the third main terminal 43 are placed so as to be adjacent to each other in a horizontal direction in the hollow space of the resin case 3.

Two of a semiconductor chip 51 and a semiconductor chip 52 are placed in array along an extending direction of the first main terminal 41 in one of the hollow spaces of the resin case 3 bisected by the first main terminal 41, the second main terminal 42, and the third main terminal 43, and two of a semiconductor chip 53 and a semiconductor chip 54 are placed in array along the extending direction of the first main terminal 41 in the other space.

In this embodiment, the semiconductor chips 51 to 54 are all reverse conducting IGBTs (RC-IGBTs) having an IGBT and a FWD both integrated on one chip. The semiconductor chip 51 and the semiconductor chip 52 which are disposed in array along one side of the first main terminal 41 are connected electrically in parallel to each other. The semiconductor chip 51 and the semiconductor chip 52 correspond to a group of semiconductor chips U on a side of higher electric potential. The group of semiconductor chips U configures an upper arm in one phase configuring an inverter circuit. The semiconductor chip 53 and the semiconductor chip 54 which are disposed in array along the other side of the first main terminal 41 are connected electrically in parallel to each other. The semiconductor chip 53 and the semiconductor chip 54 correspond to a group of semiconductor chips L on a side of lower electric potential. The group of semiconductor chips L configures a lower arm in one phase configuring the inverter circuit.

In other words, in this embodiment, the group of semiconductor chips U on the side of higher electric potential and the group of semiconductor chips L on the side of lower electric potential are disposed in the hollow spaces of the resin case 3 in such a way that they interpose the first main terminal 41, the second main terminal 42, and the third main terminal 43.

Each of the semiconductor chip 51 and semiconductor chip 52 configuring the group of semiconductor chips U on the side of higher electric potential are mounted on each of separate insulating substrates 6 in the examples depicted in FIG. 1 to FIG. 3. Further, each of the semiconductor chip 53 and the semiconductor chip 54 configuring the group of semiconductor chips L on the side of lower electric potential are mounted on each of the separate insulating substrates 6 in the example depicted in FIG. 1 to FIG. 3. These insulating substrates 6 consist of a metal plate 6a bonded to the base plate 2 by a bonding material such as solder so as to face the base plate, an insulating plate 6b made of an insulation material such as insulation ceramic and insulation resin, and a circuit plate 6c including a wiring pattern formed on the insulating plate 6b, which are stacked in the above-mentioned order.

The first main terminal 41 has an extending portion 41a extending, toward the group of semiconductor chips L on the side of lower electric potential, in a direction orthogonal to the above-mentioned extending direction of the main body of the first main terminal 41. A T-shaped beam portion 3b of the resin case 3 is placed between the extending portion 41a and the base plate 2. This extending portion 41a extends in such a way that it is positioned between the semiconductor chip 53 and the semiconductor chip 54 in the group of semiconductor chips L on the side of lower electric potential, and the extending portion electrically connects the semiconductor chip 53 and the semiconductor chip 54. More specifically, the extending portion 41a is electrically connected by its mechanical connection to each of the circuit plate 6c of the insulating substrate 6 surmounted by the semiconductor chip 53 and the circuit plate 6c of the insulating substrate 6 surmounted by the semiconductor chip 54. This mechanical connection is carried out by ultrasonic bonding, welding such as laser welding, or bonding using a bonding material such as solder.

In other words, the semiconductor chip 53 and the semiconductor chip 54 are disposed axisymmetrically with respect to the extending portion 41a of the first main terminal 41. The word "axisymmetrically" herein means that the semiconductor chip 53 and the semiconductor chip 54 are positioned by one side of the extending portion 41a and by the other side of the extending portion 41a, respectively, in such a way that they interpose the extending portion 41a. It does not mean that the semiconductor chip 53 and the semiconductor chip 54 are positioned at a mathematically strictly equal spacing from the extending portion 41a. It includes a case of unequal spacing owing to the size of the semiconductor chip, the attachment accuracy of the semiconductor chip, or the like. Specifically, a spacing difference of, for example, about 3 mm is tolerable.

The first main terminal 41 is connected, by bonding wires 71, to an emitter electrode and an anode electrode which are placed on the front surface of the semiconductor chip 51 in the group of semiconductor chips U on the side of higher electric potential. Similarly, the first main electrode is connected, by bonding wires 72, to an emitter electrode and an anode electrode which are placed on the front surface of the semiconductor chip 52. The bonding wires 71 and the bonding wires 72 extend toward the group of semiconductor chips U on the side of higher electric potential positioned opposite to the extending direction of the extending portion 41a of the first main terminal 41. The bonding wires 71 and the bonding wires 72 are disposed axisymmetrically with respect to a portion virtually extending from the extending portion 41a toward the group of semiconductor chips U on the side of higher electric potential. The word "axisymmetrically" herein means that the bonding wires 71 and the bonding wires 72 are positioned in such a way that they interpose the virtual extending portion (or the center line thereof). It does not mean that the bonding wires 71 and the bonding wires 72 are positioned at a mathematically strictly equal spacing from the extending portion. It includes a case of unequal spacing owing to the size of the semiconductor chip, the attachment accuracy of the semiconductor chip, or the like. Specifically, a spacing difference of, for example, about 3 mm is tolerable.

The second main terminal 42 is disposed closer to the base plate 2 in the vertical direction than the first main terminal 41. In other words, the second main terminal 42 is placed at a lower height from the front surface of the base plate 2 than the first main terminal 41. The second main terminal 42 has an extending portion 42a extending, toward the group of semiconductor chips U on the side of higher electric potential, in a direction orthogonal to the above-mentioned extending direction of the main body of the second main terminal 42. This extending portion 42a extends in such a way that it is interposed between the semiconductor chip 51 and the semiconductor chip 52 in the group of semiconductor chips U on the side of higher electric potential, and it is electrically connected to the semiconductor chip 51 and the semiconductor chip 52. More specifically, the extending portion 42a is electrically connected by its mechanical connection to each of the circuit plate 6c of the insulating substrate 6 surmounted by the semiconductor chip 51 and the circuit plate 6c of the insulating substrate 6 surmounted by the semiconductor chip 52. This mechanical connection is carried out by ultrasonic bonding, welding such as laser welding, or bonding using a bonding material such as solder.

This extending portion 42a and the extending portion 41a of the first main terminal 41 are positioned preferably on the same straight line L1 in the plan view of FIG. 1. The center line of the extending portion 41a and that of the extending portion 42a approximately coincide with each other when the power semiconductor module 1 is viewed from the top.

The semiconductor chip 51 and the semiconductor chip 52 are disposed axisymmetrically with respect to the extending portion 42a of the second main terminal 42. The word "axisymmetrically" herein means that the semiconductor chip 51 is positioned by one side of the extending portion 42a and the semiconductor chip 52 is positioned by the other side of the extending portion 42a in such a way that they interpose the extending portion 42a. It does not mean that the semiconductor chip 51 and the semiconductor chip 52 are positioned at a mathematically strictly equal spacing from the extending portion 42a. It includes a case of unequal spacing owing to, for example, the size of semiconductor chip and the attachment accuracy of the semiconductor chip. Specifically, a spacing difference of, for example, about 3 mm is tolerable.

A third main terminal 43 placed in array with the second main terminal 42 in a horizontal direction is connected, by bonding wires 73, to an emitter electrode and an anode electrode which are placed on the front surface of the semiconductor chip 53 in the group of semiconductor chips L on the side of lower electric potential. Similarly, the third main terminal 43 is connected, by bonding wires 74, to an emitter electrode and an anode electrode which are placed on the front surface of the semiconductor chip 54.

The bonding wires 73 and the bonding wires 74 connected to the third main terminal 43 extend toward the group of semiconductor chips L on the side of lower electric potential. The bonding wires 73 and bonding wires 74 are axisymmetrically disposed with respect to the extending portion 41a of the first main terminal 41. The word "axisymmetrically" herein means that the bonding wires 73 and the bonding wires 74 are positioned in such a way that they interpose the extending portion 41a. It does not mean that the bonding wires 73 and the bonding wires 74 are positioned at a mathematically strictly equal spacing from the extending portion. It includes a case of unequal spacing owing to the size of the semiconductor chip, the attachment accuracy of the semiconductor chip, or the like. Specifically, a spacing difference of, for example, about 3 mm is tolerable.

Further as depicted in FIG. 2, a control terminal 81 attached to the resin case 3 is connected, by bonding wires 75, to a gate electrode formed on the front surface of the semiconductor chip 51. Similarly, a control terminal 82 is connected, by bonding wires 76, to a gate electrode formed on the front surface of the semiconductor chip 52. Further, a control terminal 83 is connected, by bonding wires 77, to a gate electrode formed on the front surface of a semiconductor chip 53. Still further, a control terminal 84 is connected, by bonding wires 78, to a gate electrode formed on the front surface of a semiconductor chip 54.

The first main terminal 41, the second main terminal 42, the third main terminal 43, the semiconductor chips 51, 52, 53, and 54, the circuit plate 6c of the insulating substrate 6, the bonding wires 71, 72, 73, 74, 75, 76, 77, and 78, which are contained in the hollow space of the resin case 3 are insulated by a sealing material, such as epoxy resin and silicone gel, injected from the opening of the resin case 3. FIGS. 1 to 3 do not depict the sealing material for facilitating understanding of the present invention.

Figure 4:
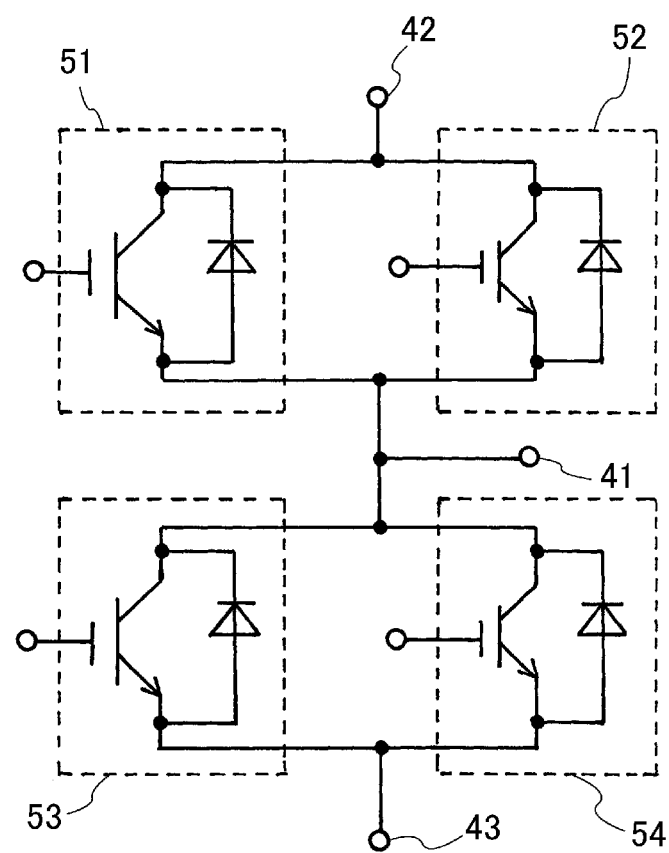
FIG. 4 is an electric circuit diagram of the power semiconductor module in FIG. 1.

FIG. 4 depicts an electric circuit of the power semiconductor module 1 depicted in FIG. 1 and FIG. 2. The semiconductor chips 51 and 52 in the group of semiconductor chips U on the side of higher electric potential configure an upper arm, and the semiconductor chips 53 and 54 in the group of semiconductor chips L on the side of lower electric potential configure a lower arm.

In the power semiconductor module 1 of this embodiment, the group of semiconductor chips U on the side of higher electric potential and the group of semiconductor chips L on the side of lower electric potential are disposed in such a way that they interpose the first main terminal 41 bisecting the hollow space of the resin case 3. Further, plural chips of the semiconductors chips 51 and the semiconductor chips 52 configuring the group of semiconductor chips U on the side of higher electric potential are disposed in array along the extending direction of the first main terminal 41. Still Further, plural chips of the semiconductor chips 53 and the semiconductor chips 54 configuring the group of semiconductor chips L on the side of lower electric potential are disposed in array along the extending direction of the first main terminal 41. Still further, the extending portion 41a of the first main terminal 41 is disposed in such a way that it is interposed between the two adjacent semiconductor chips 53 and 54 in the group of semiconductor chips L on the side of lower electric potential. According to the above, the configuration of the wiring can be simplified in the hollow space of the resin case 3. Accordingly, miniaturization can be achieved in comparison to the conventional power semiconductor module 100 having a complex wiring, and wiring inductance can be also reduced.

In addition, since the power semiconductor module 1 of this embodiment includes the semiconductor chip 53 and the semiconductor chip 54 disposed axisymmetrically with respect to the extending portion 41a of the first main terminal 41, the wiring length of the semiconductor chip 53 is equal to that of the semiconductor chip 54, thus improving synchroneity for the switching operation of the semiconductor chip 53 and the semiconductor chip 54. Moreover, since the bonding wire 71 and the bonding wire 72 are disposed axisymmetrically with respect to a portion virtually extending from the extending portion 41a toward the group of semiconductor chips U on the side of higher electric potential, the wiring length of the semiconductor chip 51 is equal to that of the semiconductor chip 52, thus improving synchroneity for the switching operation of the semiconductor chip 51 and the semiconductor chip 52.

Further, since the power semiconductor module 1 of this embodiment includes four semiconductor chips 51, 52, 53, and 54 disposed at an equal spacing from one another in the hollow space of resin case 3, it can be made excellent to dissipate heat from the respective semiconductor chips via the base plate 2 and via the main terminals or the bonding wires.

Still further, the power semiconductor module 1 of this embodiment allows usage of separate insulating substrates 6 for the group of semiconductor chips U on the side of higher electric potential and the group of semiconductor chips L on the side of lower electric potential, respectively, so that the insulating substrates correspond to the respective internal spaces in the resin case 3 which are bisected by the first main terminal 41. This enables reducing the warpage generation of the base plate 2 owing to thermal stress in comparison to a case which uses an insulating substrate of a size approximately equal to that of the opening of the resin case 3 as in the case of the conventional power semiconductor module 100, and as a result, this improves the reliability of power semiconductor module 1 by enhancing the cooling effect. In addition, the cost of the insulating substrate 6 can be reduced.

In particular, when separate insulating substrates 6 are used not only for each of the semiconductor chip 51 and the semiconductor chip 52 configuring the group of semiconductor chips U on the side of higher electric potential but also for each of the semiconductor chip 53 and the semiconductor chip 54 configuring the group of semiconductor chips L on the side of lower electric potential, the warpage generation of the base plate 2 owing to thermal stress can be particularly reduced. In addition, since the same wiring pattern is formed on the respective insulating substrates 6 in this case, the insulating substrates 6 can be commonalized, and therefore the cost of the insulating substrates 6 can be reduced.

Figure 5A:
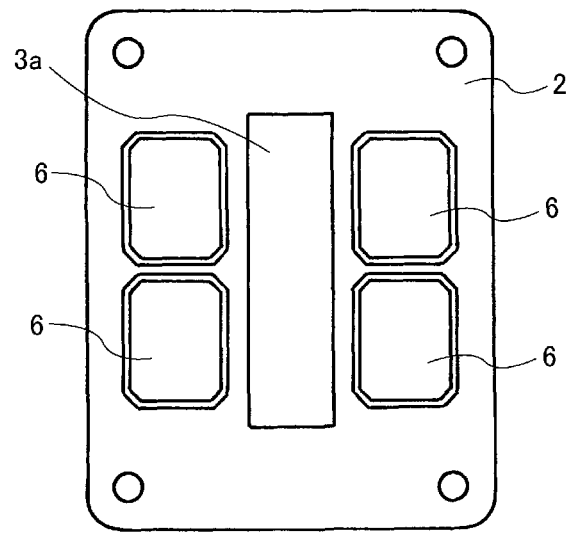
FIG. 5(a) is a schematic plan view of a base plate of the power semiconductor module in FIG. 1.
Figure 5B:
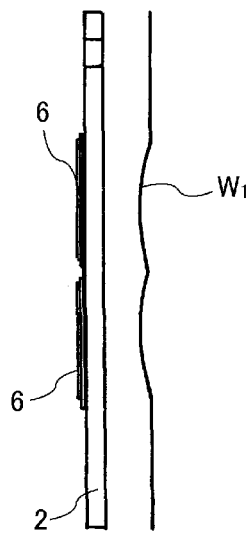
FIG. 5(b) is a schematic front view of the base plate in FIG. 5(a)
Figure 5C:
FIG. 5(c) is a schematic side view of the base plate of FIG. 5(a).
Figure 6A:
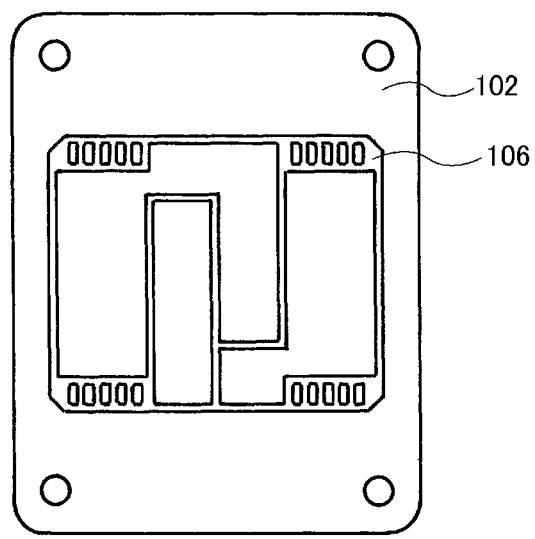
FIG. 6(a) is a schematic plan view of the base plate of a conventional power semiconductor module.
Figure 6B:
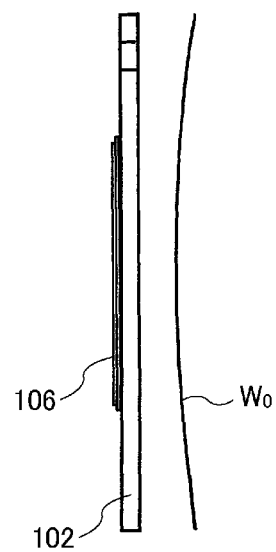
FIG. 6(b) is a schematic front view of the base plate in FIG. 6(a)
Figure 6C:
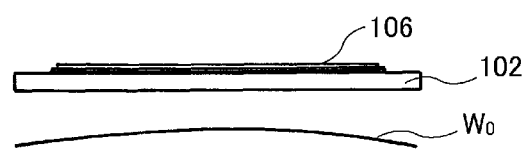
FIG. 6(c) is a schematic side view of the base plate in FIG. 6(a).

FIGS. 5(a)-5(c) schematically depict the warpage W1 of the base plate 2 of the power semiconductor module 1 of this embodiment. FIG. 5(a) is a schematic plan view of the base plate 2 of the power semiconductor module 1 of this embodiment, and FIG. 5(b) is a schematic front view of the base plate 2 in FIG. 5(a), and FIG. 5(c) is a schematic side view of the base plate 2 in FIG. 5(a). FIGS. 6(a)-6(c) schematically depict the warpage W0 of a base plate 102 of a conventional power semiconductor module 100 for comparison. FIG. 6(a) is a schematic plan view of the base plate 102 of the conventional power semiconductor module 100, and FIG. 6(b) is a schematic front view of the base plate 102 in FIG. 6(a), and FIG. 6(c) is a schematic side view of the base plate 102 in FIG. 6(a). According to the comparison of FIGS. 5(a)-5(c) with FIGS. 6(a)-6(c), since the base plate 2 of the power semiconductor module 1 of this embodiment uses respective separate insulating substrates 6 for the semiconductor chip 51, the semiconductor chip 52, the semiconductor chip 53, and semiconductor chip 54, the warpage of the base plate 2 can be reduced in comparison to the conventional power semiconductor module 100.

Moreover, since the power semiconductor module 1 of this embodiment has the first main terminal 41 and the second main terminal 42 placed in such a way that they overlap partially with each other in the vertical direction, increase in the area of regions for wiring can be reduced. Further, the first main terminal 41 and the second main terminal 42 are close in parallel to each other across an insulator such as an insulating resin plate, enabling reduction of mutual inductance.

Further, since the extending portion 41a of the first main terminal 41 and the extending portion 42a of the second main terminal are positioned on the same straight line, the semiconductor chip 53 and the semiconductor chip 54 are disposed axisymmetrically with respect to the extending portion 41a of the first main terminal 41, and since the semiconductor chip 51 and the semiconductor chip 52 are disposed axisymmetrically with respect to the extending portion 42a of the second main terminal 42, the four semiconductor chips can be disposed more evenly in the hollow space of the resin case 3.

The extending portion 41a of the first main terminal 41 has a shape having a base portion 41c connected to a main body portion 41b of the first main terminal 41 and a tip portion 41d the width of which is preferably narrower than that of the base portion. The tip portion 41d of the extending portion 41a has a portion of a comb-like shape, which is bent, toward the insulating substrate 6, at the first main terminal 41 positioned at higher height than the main surface of the base plate 2, and is connected to the substrate. The shape having the tip portion 41d the width of which is narrower than that of the base portion 41c facilitates bending processing.

The extending portion 42a of the second main terminal 42 has, as in the case of the extending portion 41a of the first main terminal 41, a shape having a base portion 42c connecting to a main body portion 42b of the second main terminal 42 and a tip portion 42d the width of which is preferably narrower than that of the base portion. This facilitates bending processing of the comb-like shape of the tip 42d of the extending portion 42a.

The extending portion 42a of the second main terminal 42 is placed at a position which has a lower height from the front surface of the base plate 2 than the first main terminal 41. Moreover, the second main terminal 42 has, at the base portion 42c of the extending portion 42a, a raising portion 42e extending away from the front surface of the base plate 2 (See FIG. 3). The extending portion 42a having the raising portion 42e enables bending the portion of the comb-like shape of the tip portion 42d of the extended portion 42a, at a height nearly equal to the height of the extending portion 41a of the first main terminal 41 toward the insulating substrate 6, to which the portion of the comb-like shape is connected. This enables enhancing the reliability of the bonding.

Since the third main terminal 43 is placed close to the second main terminal 42 in array in the horizontal direction, mutual inductance can be reduced.

The bonding wires 73 and the bonding wires 74 connected to the third main terminal 43 are preferably disposed axisymmetrically with respect to the extending portion 41a of the first main terminal 41. This leads to the equality of the wiring lengths of the semiconductor chip 53 and the semiconductor chip 54, thereby improving synchroneity of switching operation of the semiconductor chip 53 and the semiconductor chip 54.

Although in the depicted power semiconductor module 1 of this embodiment the semiconductor chips 51, 52, 53, and 54 use RC-IGBTs, a configuration is also possible which is provided with IGBT chips and FWD chips separately. Other switching elements can also be used such as well-known MOSFET chips other than IGBT chips.

Although the depicted power semiconductor module 1 of this embodiment is configured by two of the semiconductor chips 51 and the semiconductor chip 52 placed in the group of semiconductor chips U on the side of higher electric potential and two of the semiconductor chips 53 and the semiconductor chip 54 placed in the group of semiconductor chips L on the side of lower electric potential, the number of the semiconductor chips disposed in the group of semiconductor chips U on the side of higher electric potential and in the group of semiconductor chips L on the side of lower electric potential is not limited to two. However, the number of the semiconductor chips in the group of semiconductor chips U on the side of higher electric potential is preferably equal to that of the semiconductor chips in the group of semiconductor chips L on the side of lower electric potential. For example, when the number of the semiconductor chips in the group of semiconductor chips U on the side of higher electric potential and that in the group of semiconductor chips L on the side of lower electric potential are each three, extending portions 41a of the first main terminal 41 are placed at two positions in total in the first main terminal 41 in such a way that they are interposed between the adjacent semiconductor chips in the group of semiconductor chips L on the side of lower electric potential. Further, extending portions 42a of the second main terminal 42 are placed at two positions in total in the second main terminal 42 in such a way that they are interposed between the adjacent semiconductor chips on the group of semiconductor chips U on the side of higher electric potential.

Next, an explanation will be made for one example of methods for manufacturing the power semiconductor module 1 of this embodiment.

Figure 7A:
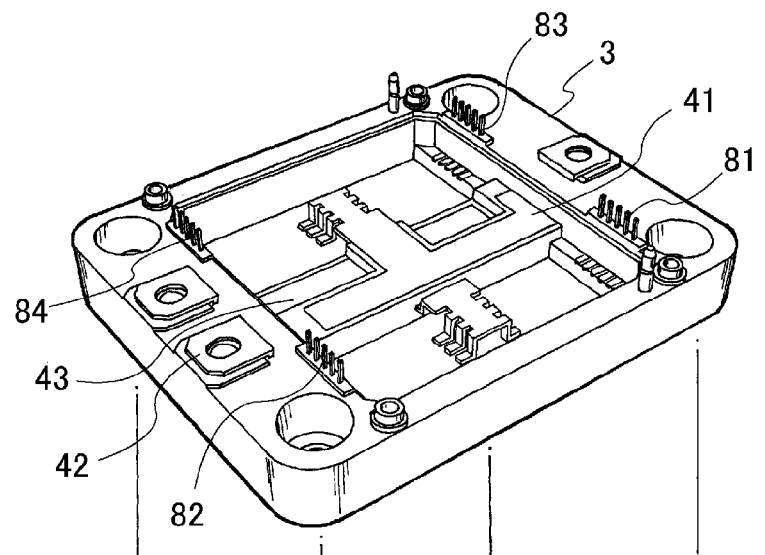
FIG. 7(a) is a perspective view of an insert-formed resin case for explaining a method for manufacturing the power semiconductor module in FIG. 1.

As depicted in the perspective view of FIG. 7(a), a resin case 3 and main terminals 41, 42, and 43, and control terminals 81, 82, 83, and 84 are previously formed integrally by insert-form.

Figure 7B:
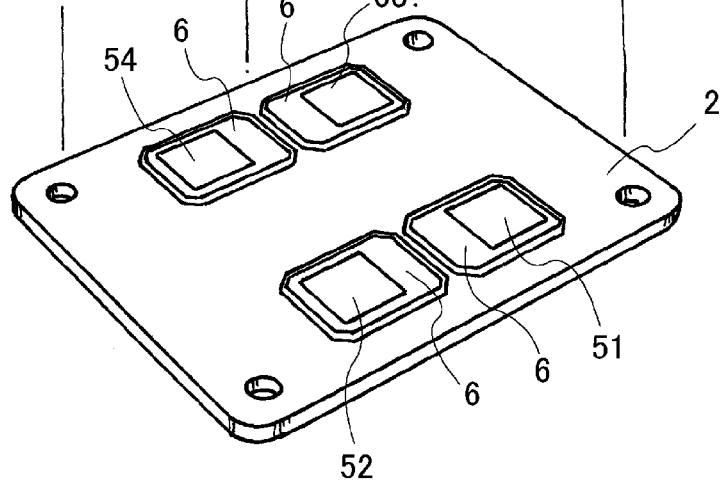
FIG. 7(b) is a perspective view of a base plate having an insulating substrate bonded thereto for explaining a method for manufacturing the power semiconductor module in FIG. 1.

As depicted in the perspective view of FIG. 7(b), semiconductor chips 51, 52, 53, and 54 are bonded by solder or the like to an insulating substrate 6, which is then bonded to a base plate 2 by solder or the like.

The insert-formed resin case 3 is fixed, by adhesive, to the base plate 2 having the insulating substrate 6 bonded thereto.

An emitter electrode and an anode electrode of the semiconductor chips 51 and 52 are connected to the first main terminal 41 by bonding wires 71 and 72. The tip portion 41d of the extending portion 41a of the first main terminal 41 is bonded to the circuit plate of respective insulating substrates 6 surmounted by the semiconductor chips 53 and 54. The tip portion 42d of the extending portion 42a of the second main terminal 42 is bonded to a circuit plates 6c of the respective insulating substrate 6 surmounted by the semiconductor chips 51 and 52. The emitter electrode and the anode electrode of the semiconductor chips 53 and 54 are connected to a third main terminal 43 by bonding wires 73 and 74.

A gate electrode of the semiconductor chip 51 is connected to the control terminal 81 by bonding wires 75. A gate electrode of the semiconductor chip 52 is connected to the control terminal 82 by bonding wires 76. A gate electrode of the semiconductor chip 53 is connected to the control terminal 83 by bonding wires 77. A gate electrode of the semiconductor chip 54 is connected to the control terminal 84 by bonding wires 78.

The power semiconductor module 1 as depicted in FIG. 1 and FIG. 2 can be obtained via the above-described steps.

Embodiment 2

Figure 8:
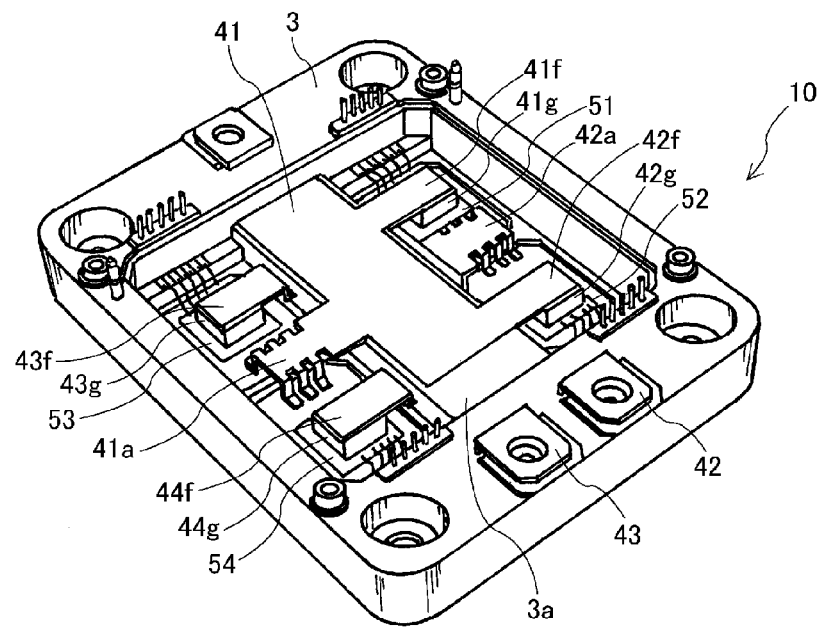
FIG. 8 is a perspective view of a power semiconductor module of Embodiment 2 of the present invention.
Figure 9:
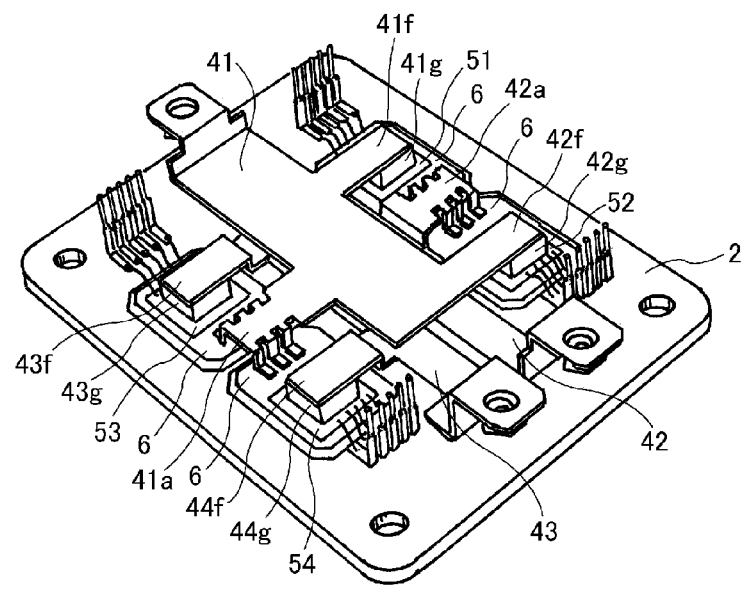
FIG. 9 is a perspective view depicting the internal structure of the power semiconductor module in FIG. 8.
Figure 10:
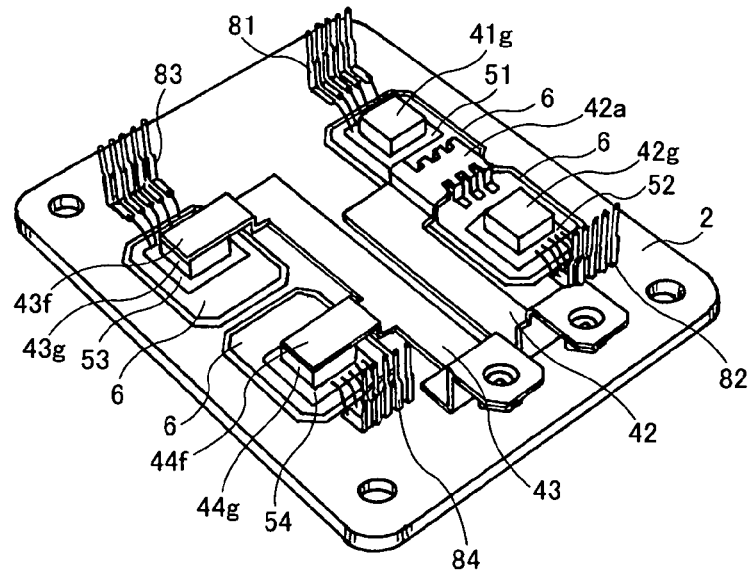
FIG. 10 is a perspective view depicting the internal structure of the power semiconductor module in FIG. 8.
Figure 11:
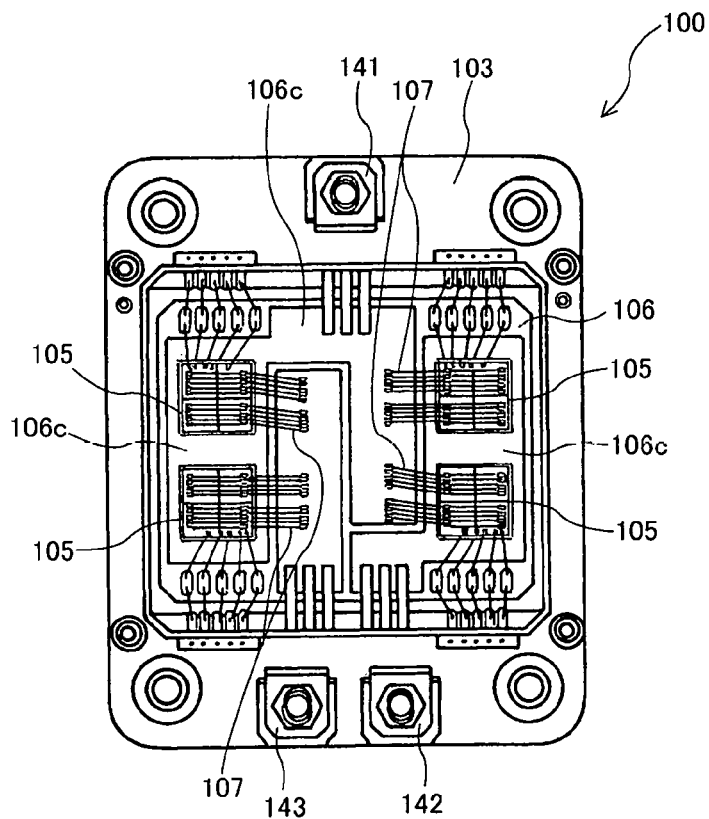
FIG. 11 is a plan view of a conventional power semiconductor module.

Next, Embodiment 2 of the power semiconductor module of the present invention will be explained with reference to FIG. 8 to FIG. 10. FIG. 8 is a perspective view of a power semiconductor module 10 of this embodiment. FIG. 9 is a perspective view of the internal structure excluding the resin case 3 in FIG. 8. FIG. 10 is a perspective view of the internal structure further excluding the first main terminal in FIG. 9. In FIGS. 8 to 10, the same symbols are assigned to the same members as those in FIGS. 1 to 3. Accordingly, for the members of the power semiconductor module of this embodiment, explanations duplicated to those already made with reference to FIGS. 1 to 3 will be omitted in the following explanations.

The power semiconductor module 10 of this embodiment uses a lead in place of the bonding wires 71 and 72 used for the power semiconductor module of Embodiment 1 depicted in FIG. 1, to connect electrically the first main terminal 41 to the electrodes formed on the front surfaces of the semiconductor chip 51 and the semiconductor chip 52. In addition, it uses a lead in place of the bonding wires 73 and 74 used for the power semiconductor module of Embodiment 1 as depicted in FIG. 1, to connect electrically the third main terminal 43 to the electrodes formed on the front surfaces of the semiconductor chip 53 and the semiconductor chip 54. In FIGS. 8 to 10, the leads are integrated with the first main terminal 41 or the third main terminal 43. As a consequence, the leads are second extending portions 41f and 42f of the first main terminal 41, and extending portions 43f and 44f of the third main terminal 43. In this embodiment, from the viewpoint of heat dissipativity to the upper surface of the semiconductor chip and easiness of assembly, a copper block 41g and a copper block 42g are interposed between the second extending portion 41f of the first main terminal 41 and the semiconductor chip 51 and between the second extending portion 42f and the semiconductor chip 52, respectively. The second extending portions 41f and 42f are bonded to the copper blocks 41g and 42g preferably by laser welding. Further, the copper blocks 41g and 42g are bonded to the semiconductor chips 51 and 52 preferably by a bonding material such as solder. Similarly, from the viewpoint of heat dissipativity to the upper surface of the semiconductor chip and easiness of assembly, the copper block 43g and the copper block 44g are interposed between the extending portion 43f of the third main terminal 43 and the semiconductor chip 53 and between the extending portion 44f and the semiconductor chip 54, respectively. The extending portions 43f and 44f are bonded to the copper blocks 43g and 44g preferably by laser welding. Further, the copper blocks 43g and 44g are bonded to the semiconductor chips 53 and 54 preferably by a bonding material such as solder.

The power semiconductor module 10 of this embodiment also exhibits the same effect as that of the power semiconductor module 1 of Embodiment 1. Further, using leads in place of bonding wires can reduce the height of the power semiconductor module 10.

As described above, the semiconductor device of the present invention has been explained with reference to each of the embodiments and the drawings, but the semiconductor device of the present invention is not limited to those described in each of the embodiments and the drawings and can be variously modified within the scope not departing from the spirit of the present invention.

DESCRIPTION OF SYMBOLS 1, 10 power semiconductor module (semiconductor device)
2 base plate
3 resin case
41 first main terminal (one main terminal)
42 second main terminal (another main terminal)
43 third main terminal (different main terminal)
51, 52, 53, 54 semiconductor chip (semiconductor element)
6 insulating substrate
6c circuit plate
71, 72, 73, 74 bonding wire
81, 82, 83, 84 control terminal

The invention claimed is:
1. A semiconductor device comprising:
a first main terminal and a second main terminal, extending on a front surface of a base plate from one end thereof toward another end thereof;
a first semiconductor chip and a second semiconductor chip, on a side of higher electric potential, disposed in array on one side of the first main terminal and mounted on the base plate; and
a third semiconductor chip and a fourth semiconductor chip, on a side of lower electric potential, disposed in array on the other side of the first main terminal and mounted on the base plate;
wherein the first main terminal has a first main body portion extending from the one end to the another end of the base plate, and a first extending portion perpendicular to an extending direction of the first main body portion,
the second main terminal has a second main body portion extending from the one end to the another end of the base plate,
the third semiconductor chip and the fourth semiconductor chip are arranged axisymmetrically with respect to the first extending portion, and
the first main body portion and the second main body portion are spaced apart from each other perpendicularly to the front surface of the base plate.
2. The semiconductor device according to claim 1, wherein the first extending portion is electrically connected to the third and fourth semiconductor chips, and the first main terminal is connected, by bonding wires or leads, to electrodes formed on front surfaces of the first and second semiconductor chips disposed on a side opposite to a side where the first extending portion exists, wherein the bonding wires or leads are axisymmetrically disposed in an extending direction opposite to the side where the first extending portion exists.

3. The semiconductor device according to claim 1, wherein the first extending portion includes a base portion connected to the first main body portion and a tip portion, and has a shape such that a width of the tip portion is narrower than that of the base portion.

4. The semiconductor device according to claim 1, further comprising:
an insulating substrate having circuit plates on front surfaces thereof,
wherein the first, second, third and fourth semiconductor chips are mounted respectively above the insulating substrate with the circuit plates interposed therebetween, and the first extending portion is bonded to the circuit plates where the third and fourth semiconductor chips are mounted.

5. The semiconductor device according to claim 1, wherein the first, second, third and fourth semiconductor chips have same shapes.

6. The semiconductor device according to claim 1, further comprising first, second, third and fourth insulating substrates mounted on the base plate, the first, second, third and fourth semiconductor chips being respectively mounted on the first, second, third and fourth insulating substrates.

7. The semiconductor device according to claim 1, wherein the first main terminal and the second main terminal are partially overlapped in a vertical direction on the front surface of the base plate.

8. The semiconductor device according to claim 2, wherein the second main terminal includes a second extending portion perpendicular to the second main portion and extending on a side opposite to the first extending portion, and
the first semiconductor chip and the second semiconductor chip are arranged axisymmetrically with respect to the second extending portion.

9. The semiconductor device according to claim 8, wherein the second extending portion of the second main terminal has a shape comprising a tip portion, the width of which is narrower than that of the base portion.

10. The semiconductor device according to claim 8, wherein the first extending portion of the first main terminal and the second extending portion of the second main terminal are positioned on a same straight line on the front surface of the base plate.

11. The semiconductor device according to claim 8, wherein the first main terminal and the second main terminal are positioned on a same line perpendicular to a front surface of the base plate.

12. The semiconductor device according to claim 8, further comprising a third main terminal, wherein the third main terminal is connected, by bonding wires or leads, to electrodes formed on front surfaces of the third and fourth semiconductor chips disposed on a same side as a side where the first extending portion of the first main terminal exists.

13. The semiconductor device according to claim 11, further comprising an insulating plate between the first main terminal and the second main terminal.

14. The semiconductor device according to claim 11, wherein the second main terminal is placed at a lower height from the front surface of the base plate than the first main terminal, and comprises, at a base portion of the second extending portion of the second main terminal, a raising portion extending away from the front surface of the base plate.

15. The semiconductor device according to claim 5, wherein the first, second, third and fourth semiconductor chips are RC-IGBTs.

16. The semiconductor device according to claim 6, wherein the first, second, third and fourth insulating substrates include circuit plates formed with same wiring patterns.

17. The semiconductor device according to claim 6, wherein the second main terminal includes a second extending portion perpendicular to the second main body and extending in a direction opposite to the first extending portion,
the second extending portion is mechanically connected to circuit plates of the first and second insulating substrates, and
the first extending portion is mechanically connected to circuit plates of the third and fourth insulating substrates.

18. The semiconductor device according to claim 7, wherein the first main terminal and the third main terminal are partially overlapped in the vertical direction on the front surface of the base plate.

19. A semiconductor device comprising:
a first main terminal and a second main terminal, extending on a front surface of a base plate from one end thereof toward another end thereof;
a first semiconductor chip and a second semiconductor chip, on a side of higher electric potential, disposed in array on one side of the first main terminal and mounted on the base plate; and
a third semiconductor chip and a fourth semiconductor chip, on a side of lower electric potential, disposed in array on the other side of the first main terminal and mounted on the base plate;
wherein the first main terminal has a first main body portion extending from the one end to the another end of the base plate,
the second main terminal has a second main body portion extending from the one end to the another end of the base plate, and an extending portion perpendicular to an extending direction of the first main body portion,
the first semiconductor chip and the second semiconductor chip are arranged axisymmetrically with respect to the extending portion, and
the first main body portion and the second main body portion are spaced apart from each other perpendicularly to the front surface of the base plate.

* * * * *